June 11, 1963 J. HENRY-BAUDOT 3,093,762

STEP MOTOR USING PRINTED CIRCUIT COMPONENTS

Filed Jan. 4, 1960 7 Sheets-Sheet 1

Inventor
Jacques Henry-Baudot
By Kemon, Palmer and Stewart
Attorneys

June 11, 1963 J. HENRY-BAUDOT 3,093,762

STEP MOTOR USING PRINTED CIRCUIT COMPONENTS

Filed Jan. 4, 1960 7 Sheets-Sheet 2

Inventor
Jacques Henry-Baudot
By Kemon, Palmer and Stewart
Attorneys

June 11, 1963 J. HENRY-BAUDOT 3,093,762

STEP MOTOR USING PRINTED CIRCUIT COMPONENTS

Filed Jan. 4, 1960 7 Sheets-Sheet 3

INVENTOR
JACQUES HENRY-BAUDOT
BY
Kemon, Palmer, Stewart & Estabrook
ATTORNEYS

June 11, 1963 J. HENRY-BAUDOT 3,093,762

STEP MOTOR USING PRINTED CIRCUIT COMPONENTS

Filed Jan. 4, 1960 7 Sheets-Sheet 4

Inventor
Jacques Henry-Baudot
By Kemon, Palmer and Stewart
Attorneys

STEP MOTOR USING PRINTED CIRCUIT COMPONENTS

Filed Jan. 4, 1960 7 Sheets-Sheet 5

Inventor
Jacques Henry-Baudot
By Kemon, Palmer and Stewart
Attorneys

Inventor
Jacques Henry-Baudot
By Kemon, Palmer and Stewart
Attorneys

STEP MOTOR USING PRINTED CIRCUIT COMPONENTS

Filed Jan. 4, 1960

Inventor
Jacques Henry-Baudot
By Kemon, Palmer and Stewart
Attorneys 3,093,762

STEP MOTOR USING PRINTED CIRCUIT COMPONENTS

Jacques Henry-Baudot, Antony, France, assignor to Printed Motors Inc., New York, N.Y.

Filed Jan. 4, 1960, Ser. No. 186
Claims priority, application France Jan. 8, 1959
17 Claims. (Cl. 310—49)

The present invention concerns improvements in or relating to axial airgap multipolar rotating machines of the kind wherein the rotor embodies an electrical winding made of flat conductors intimately secured to the insulating faces of an annular carrier over which they are uniformly distributed in two sets of half-turns so arranged that a turn-progressing annular winding is obtained simply by making face-to-face through connections between the ends of half-turns located on opposite faces of the carrier. Such structures of machines are disclosed in my co-pending application Serial No. 1,128 filed January 7, 1960, and divided out of Ser. No. 691,434 filed October 21, 1957.

It is the object of the invention to so provide special structural arrangements in such kind of "printed" winding machines that they are operable in a step-by-step fashion, each step being of one-half of the polar pitch in the machine, the operation being caused by successive change-over of the current supplied to the rotor winding terminals.

According to a further feature of the invention, said combination further includes the association with the rotor winding of a damping conducting disc stamped with windows radially centered on the terminals of said winding.

According to a further feature of the invention, the said rings of conductor segments are formed flat and intimately adhering to a carrier annular support of insulating character.

These and further features of the invention will be fully described with reference to the accompanying drawings, wherein:

FIG. 1 shows a diagram explaining the operation of a step-by-step rotating machine in response to change-over of the current supply connections to the rotor winding thereof;

FIGS. 2 and 3 respectively show the two faces of a rotor member in a first embodiment of a machine according to the present invention;

FIGS. 4 to 7 respectively show cross-section views of several embodiments of the rotor member;

Figure 2:
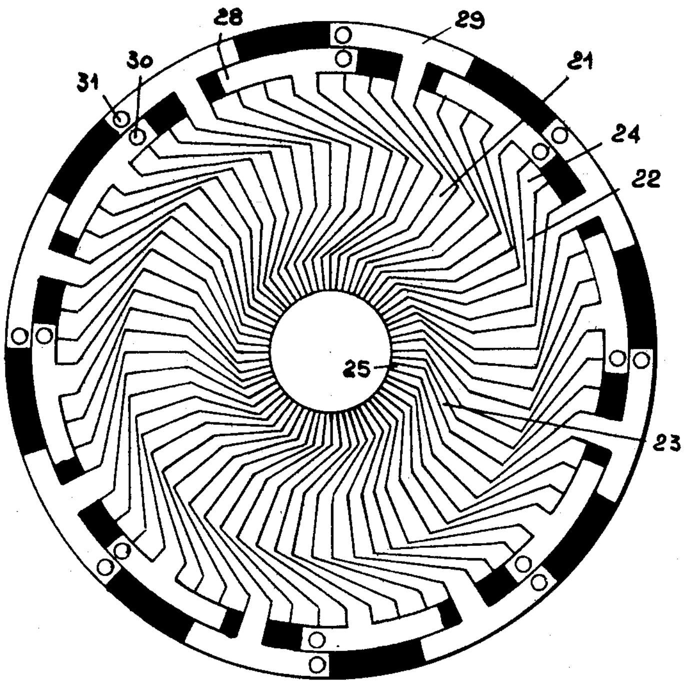
Figure 4:
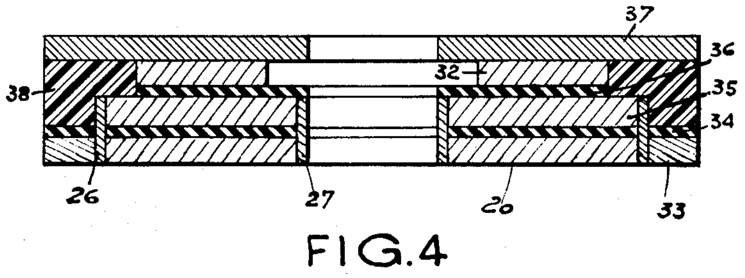
Figure 2A:
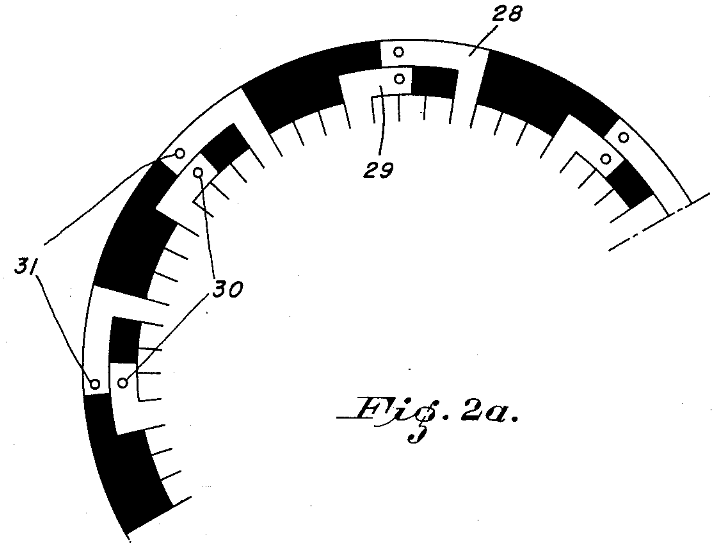
Figure 4A:
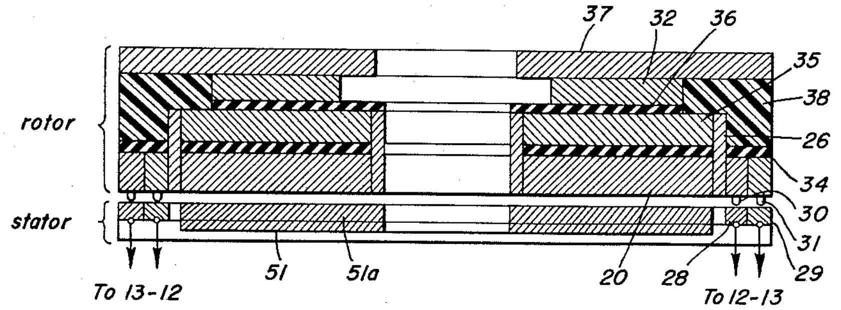

FIGURES 2*a* and 4*a* show an embodiment in which the brushes are carried by the rotor, and the segment rings are mounted on the stator.

A rotor winding of the kind used in the invention may be either of a wave type of winding pattern or a lap type of winding pattern. A lap type pattern presents an even number of conductors so that, subject to the proviso of a number of turns equal to an integer multiple of the number of pairs of magnetic poles in the machine, evenly distributed terminals spaced apart by one-half of the polar pitch can be provided which consequently will define a corresponding even number of steps for the operation of the machine. Also, it will be necessary to provide as many pairs of brushes as there are magnetic poles in the machine. A wave (or series-wave) pattern always presents an odd number of turns so that one step at least will be lengthened by the angular spacing of an additional conductor with respect to the others. However, in such a case, only a single pair of brushes is needed in the machine. Further, the number of pairs of magnetic poles to be actually present in the structure of the machine may be reduced in the inductor, viz. part of pairs of magnetic poles may be omitted when the pattern of the rotor is of the wave type. Such alternatives of embodiment of the invention will be further described and discussed herein below.

Figure 1:
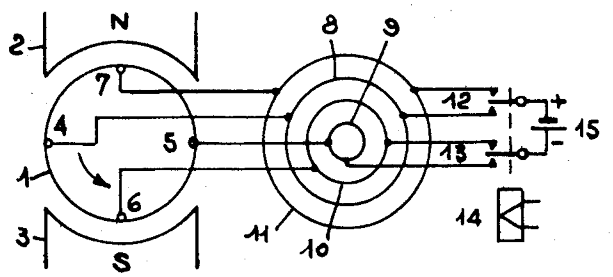

Referring to the diagram of FIG. 1, a bipolar machine is shown with a rotor winding 1 of uniform distribution around 360°. Four terminals are provided in two pairs 4—5 and 6—7. The electrical pitch of 90° is the same as the angular displacement between two adjacent terminals. For a four-pole machine, the complete revolution will cover eight steps, for a six-pole machine, twelve steps; and so on.

The two-pole rotor in the diagram of FIG. 1 is associated with one pair of polar pieces 2 and 3, North and South respectively. Two pairs of conducting rings 8—9 and 10—11 are connected on the one hand to pairs of terminals 4—5 and 6—7 of the winding and on the other hand to the two pairs of fixed contacts of two change-over switches 12 and 13 the armatures of which are connected to the terminals of a battery 15. The armatures of the change-over switches 12 and 13 are controlled from the magnet of a relay 14. Of course such a change-over relay may not actually be electromechanical but may comprise any purely electrical or electronical switching arrangement as are now well known.

One set of connections to the rings 8 to 11 is made of sliders or brushes, the other set of fixed terminals. When for instance, the rings are mechanically united to the rotor, it will be the connections from switches 12 and 13 which are made of brushes bearing on rings; and vice-versa when the rings are stationary, the connections from terminals 4 to 7 will be made by brushes bearing on rings 8 to 11.

Considering the position shown in FIG. 1 as the starting one, if and when the switches 12 and 13 are actuated to their lower condition, the terminals 4 and 5 are supplied with current and the rotor rotates by 90° of electrical pitch in the direction of the arrow. The terminals 4 and 5 are moved by the rotor to take the places of terminals 6 and 7 which in turn are brought to the positions of terminals 5 and 4 in the diagram. At the start of the step-movement, from the position shown in FIG. 1, the current supplied to terminals 4 and 5 divides and flows through two parallel paths of the armature winding, one path being through armature conductors positioned opposite the pole N and the other path including armature conductors positioned opposite the pole S, and the current in both paths tends to produce rotation in the same direction. As the armature turns from starting position and terminals 4 and 5 moves into the positions opposite the pole pieces, the torque on the rotor begins to decrease because part of the conductors in one path opposes the action of the current in the other path until the torque becomes zero when the terminals 4 and 5 are at the centers of pole pieces S and N, respectively. The condition which is then reached is a stable one and the rotor will remain stationary as long as the contacts of switches 12 and 13 are not moved. On the next change-over of switches 12 and 13, the terminals 6 and 7 are fed with current and the machine rotates by one step in the same direction as above; and so forth for each change-over of the switches 12 and 13. Of course, the direction of rotation could be changed by the insertion of further change-over or reversing switch between switches 12—13 and the terminals of the supply source 15. The change-over control proper is outside the scope of the invention and will not be further described.

Figure 3:
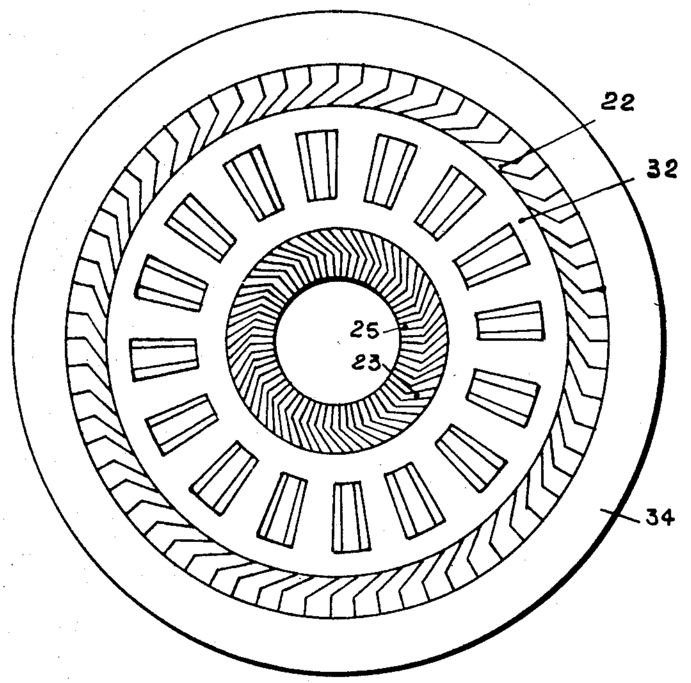

Referring now to the other figures, the description contemplates the case of an eight pole machine. In FIGS. 2 and 3, the rotor winding is of a lap type of pattern and comprises sixty-four turns, viz. sixty-four conductors per face. These conductors are "printed" or otherwise formed as thin conductor deposits intimately secured to an insulating carrier surface. Several methods for making such "printed" circuitry are known.

Each half-turn conductor comprises a portion 21 which is substantially of radial extension and sectoral shape and two inclined or curved end portions, 22 being the outer one and 23 the inner one. Each portion 22 ends in a flat terminal 24 and each portion 23 ends in a flat terminal 25. The terminals 24 are displaced by one-half angular pole width with respect to radial parts 21 of corresponding conductors and the terminals 25 on the other hand are located on substantially the same radial axes as radial parts 21 of corresponding conductors. The terminals which are aligned with each other on opposite faces are interconnected by conducting bridges such as shown at 26 and 27 on the cross-section views of FIGS. 4 to 7. The slanting of parts 22 is made such that a polar pitch is traversed from any conductor on one face to the related conductor of the outer face and conversely, any part 23 is so slanted that the conductor of one face is brought back to the conductor of the other face following that one from which the complete turn has started in the pattern. It may be stated that in the lap pattern, passing from one face to the other one by the outer terminals results in a forward pitch of eight conductors, and the back passage to the first face by the inner terminals results in a back pitch of seven conductors. Otherwise stated, numbering 1, 3, 5, . . . the conductors on one face and 2, 4, 6, . . . the conductors on the other face, conductor 2 facing conductor 3, and so on, the pattern passes from conductor 1 to conductor 16, comes back to conductor 3, and so forth.

On one face of the winding insulating carrier two rings of conductor segments, 28 and 29, are formed in coaxial relation therebetween. Each segment covers slightly more than one half of a polar pitch, in order to take care of the thickness of the brushes cooperating with those segments. The series of segments 28 are connected to terminals 24 at intervals of eight terminals, and the series of segments 29 are similarly connected to terminals 24 at intervals of eight terminals, but spaced apart by one half of a pole pitch from the terminals to which are connected the segments 28. These radial connections are also formed simultaneously with the conductors of the rings and the conductors of that face of the rotor winding. Of course, one at least of the rings may be provided adjacent the inner terminal 25 of the windings if desired.

Figure 9:
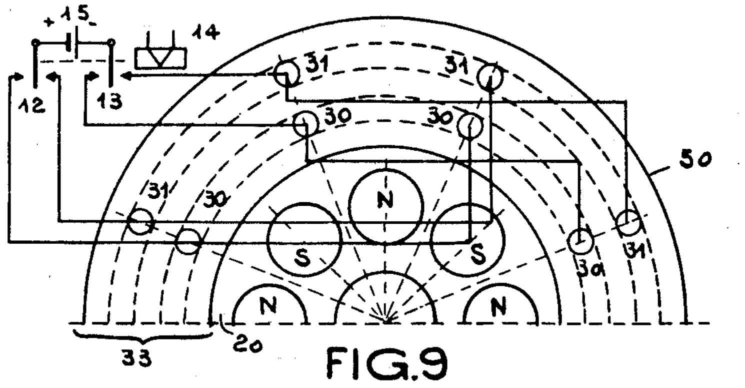
FIGS. 9 and 10 show respective half-front and top views of a machine according to FIGS. 2 and 3.
Figure 10:
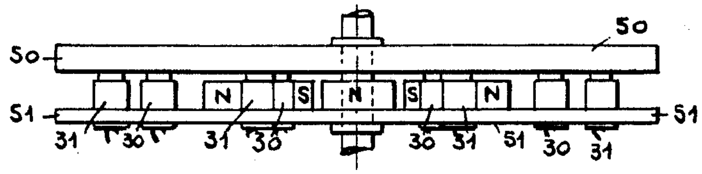

Eight pairs of brushes 30—31 cooperate with segment rings 28 and 29. These pairs of brushes are arranged with a relative displacement equal to 180° electrical degrees (a pole width) and with a displacement by 90 electrical degrees (one-half pole width) with respect to the magnetic pole axes of the machine for any stable position of the rotor after any step displacement thereof, see FIG. 1 equivalency in this respect. Such a brush arrangement with respect to the magnetic pole pieces N, S of the machine is clearly seen with reference to FIG. 9. The arrangement shown in FIGURES 9 and 10 involves a stator field structure comprising eight magnetic poles N, S, arranged in a circle opposite the annular part of the armature carrying the radial conductor portions 21, and presenting pole faces of alternative polarity to the armature disc. These magnets establish the magnetic field within the air-gap between the stator and the rotor. As shown, adjacent pairs of brushes 30, 31 are spaced apart angularly by one pole width, that is, adjacent pairs of brushes are located on radial lines passing midway between adjacent pairs of poles. Thus, each pair of brushes 30, 31 are displaced angularly by 45 electrical degrees from a radial line passing through the center of either magnetic pole on either side of the radial line passing through the two brushes. In this FIG. 9 further, there is shown the circuitry for the brushes with respect to the change-over control switches 12 and 13. On FIG. 9, the part of the rotor bearing the winding proper is denoted 20. On the top view of FIG. 10, the rotor is denoted 50, and the plate 51 is shown for supporting the brushes 30, 31 and the magnets N, S of the inductor part of the machine. Of course the inductor part may have recourse to various kinds of inductor means without departing from the scope of the invention, which is not actually concerned with such an inductor structure proper. For instance, electromagnets instead of permanent magnets may be used if required.

The operation of the machine according to FIGS. 2 and 3 is obvious from the one stated for the diagram of FIG. 1. However, in FIGS. 2 and 3, the rotor will turn only one-sixteenth of a revolution for each step, instead of one-quarter of a revolution for FIG. 1.

In structures like those of FIGURES 2 and 3, it will be of advantage to ensure a damping of the displacement of the rotor at each approach to a stopping position. For this purpose, a conducting disk 32, of copper or aluminium, is applied through an intermediate insulator film against the rear face of the winding, see FIG. 3. This disk is provided with sixteen windows of substantially sectoral shape, having their radial axes displaced by one-half of a polar pitch. Each window has an angular width slightly greater for instance than one quarter of a polar pitch and its radial axis registering with a radial position of stopping (on the opposite or front face of the winding), viz. a brush position in the machine. Then, with such a damping arrangement, each time the machine rotates, eddy currents circulate around each window so that said damping is obtained as required.

The cross-section shown in FIG. 4 strictly corresponds to the arrangement of FIGS. 2 and 3. In FIG. 4 is shown an assembly comprising a member 20—33 corresponding to the half-winding and segmented rings of FIG. 2, the conducting parts of half-winding 20 being applied on a thin insulating sheet 34 on the other face of which is formed the other half-winding 35. The conductor segments 28 and 29 are applied over the annular portion 33 of FIGURES 4 and 5. A thin insulating sheet 36 is applied over said half-winding 35 and the damping disk 32 is applied over the said sheet 36. Further, in FIG. 4, there is shown a rigid magnetic carrier plate 37 of a magnetic and insulating material. A thermosetting glue or resin may be used, as shown at 38, for better uniting the assembly.

Figure 5:
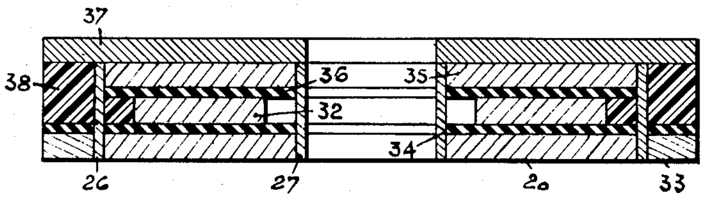

The modification of FIG. 5 shows how the damping disk 32 may be inserted between the half-winding if desired.

Figure 6:
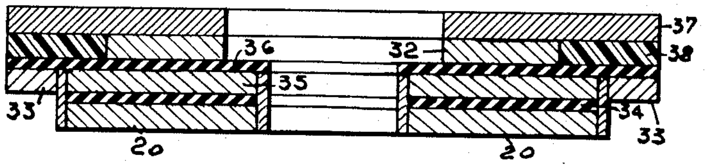
Figure 7:
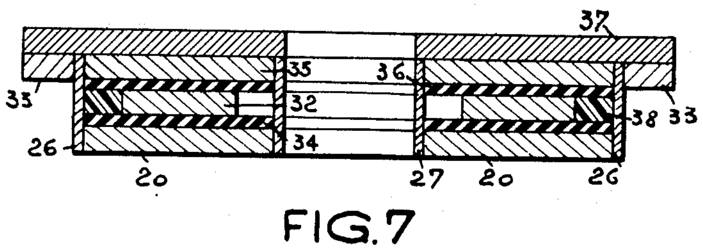

The rings 33 of conductor segment may be provided, when required, on the rear half-winding as shown in FIGS. 6 and 7, which otherwise corresponds to the sandwiches of FIGS. 4 and 5. Other modifications may be contemplated without departing from the spirit of the invention, as concerns the sandwiches, such for instance as the provision of the brushes on the rear face with respect to the inductor structure, provision of a rigid magnetic and insulating disk between the half-windings, and so forth.

Figure 8:
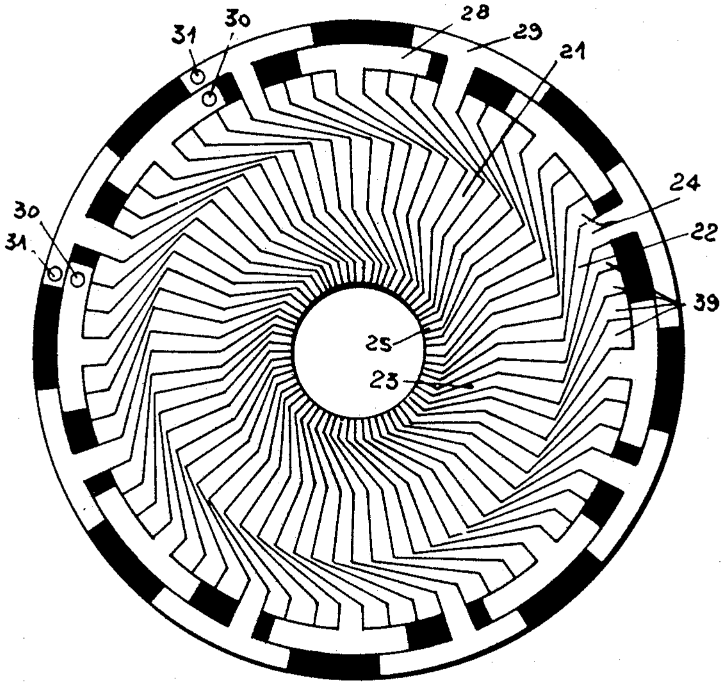
FIG. 8 shows a front view of a rotor member modified with respect to the member of FIG. 2.

For the switching purposes, it is apparently of advantage to be able to reduce the number of brushes to two pairs only. This is possible when, according to FIG. 8, the rotor winding is made of a series-wave pattern. This presents the drawback that one stepping position of the rotor is slightly asymmetrical with respect to the neighbouring one, but this drawback becomes less and less important as the number of steps is increased, viz. as the number of poles of the machine is increased. In FIG. 8, the winding has sixty-five turns, for eight poles in the machine. The arrangement is similar to that of FIG. 2 but for the fact that, at the place referred to by 39, there are four terminals 24, instead of the usual three, located between the two adjacent connections to the segments of the two rings. Further, only two pairs of brushes are shown as this suffices for a series wave winding, as is known per se. The inclined portions 23 are of the same direction of slanting as the outer portions 22 of the conductors and the inner and outer terminals 25 and 24 are in due registration in the radial direction and displaced with respect to the radial portions of the conductors. With the same numbering as above for the conductors of the two faces, the pattern starting from conductor 1 passes to conductor 18, comes back to conductor 33 and so forth.

Figure 11:
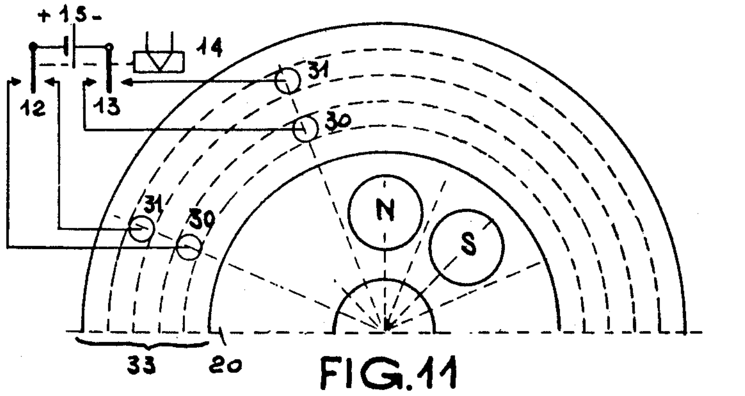
FIGS. 11 and 12 show respective half-front and top views of a machine according to FIG. 8.
Figure 12:
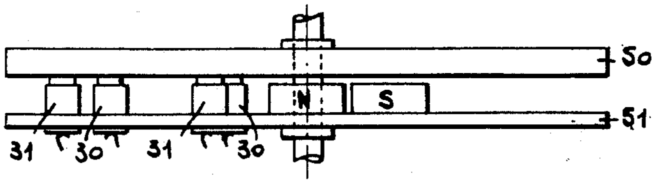

In FIGS. 11 and 12 are shown views for a machine according to FIG. 8, in that two pairs of brushes only are provided therein. Further, the number of pole pieces in the machine may be reduced and, as shown in FIGS. 11 and 12, only one pair of magnetic poles have been provided. It is not at all imperative that the positions of the brushes register with the positions of the magnetic poles. The fictitious "poles" are determined only by the winding. Nevertheless, in a machine comprising a relatively high number of "poles," it will be preferable to provide more than one pair of actual poles. For instance, in an embodiment of a machine having eighteen "poles," three pairs of actual magnetic poles may be used in order to increase the efficiency thereof.

Figure 13:
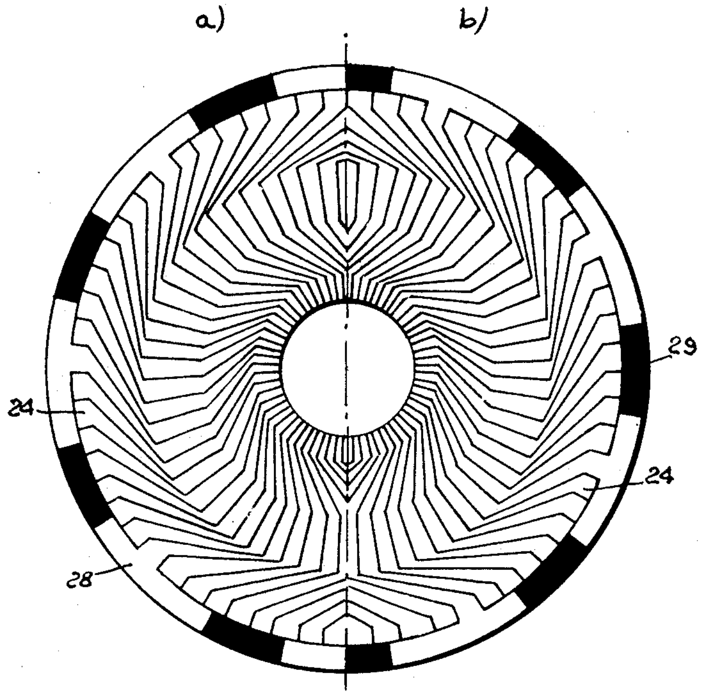
FIGS. 13 and 14 show respective half-front and half-cross-section views of another embodiment of a machine according to the invention.
Figure 14:
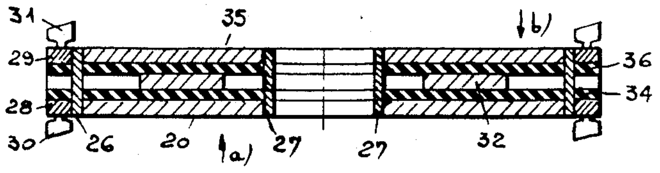

Instead of providing the rings 33 on the same side of the rotor, it is quite feasible, see FIGS. 13 and 14, to arrange a ring of segments 28 on one side and the other rings of segments 29 on the other side of the rotor. As shown, brushes 30 and 31 may be mounted on both sides of the rotor which, in a certain respect, is more advantageous for the mechanical equilibrium of the rotating member of the machine. The magnetic plate may then be omitted from the rotor and may be included in the stator on the side opposite to that of the inductor member of the machine.

Figure 15:
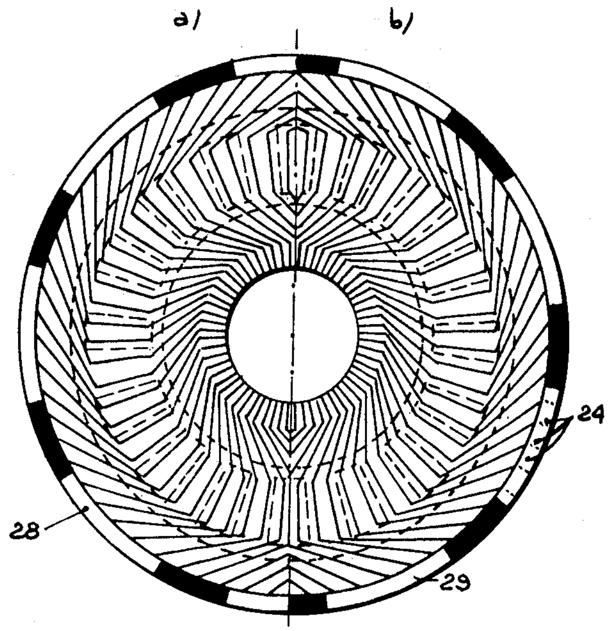
FIG. 15 shows a half-front view of a further embodiment of a machine according to the invention, FIGS. 16 and 17 respectively showing cross-section views of machine according to FIG. 15.
Figure 16:
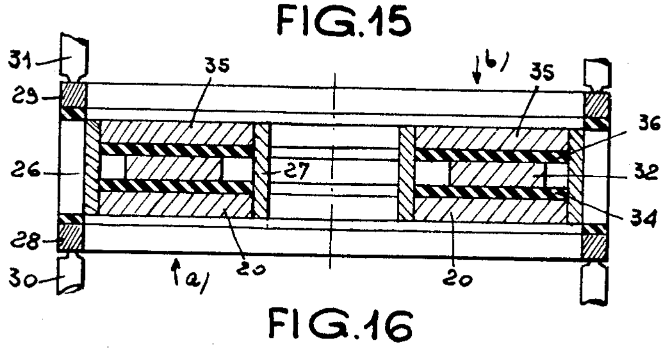
Figure 17:
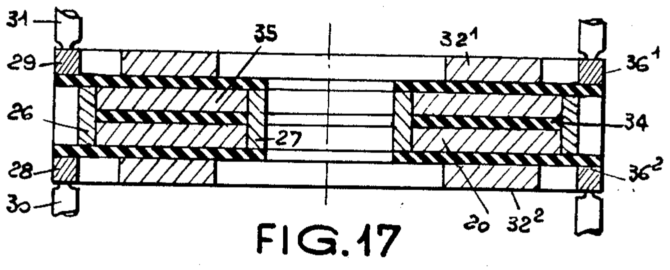

When it is considered undesirable to increase the diameter of the rotor member by the rings, it is possible to provide the rings of conductor segments on two separate insulating and annular sheets and to apply these members over part of the winding proper; the connections between the segments and the terminals of the windings will then be made through the insulating material carrying the segment rings. FIGS. 15 and 16 show such a scheme. Further, as shown on FIG. 17, it may be of advantage to "print" the segment rings 28 and 29 together with two apertured disk surfaces 32[1] and 32[2] of conducting material and to apply such members on either sides of a preformed "printed" winding proper. The connections from the segments to the terminals of the windings will be made through the insulator and each apertured disk portion will act as a damping disk for the machine in the same manner as disk 32 in FIGS. 3 to 5; of course the windows or apertures provided in both disks 32[1] and 32[2], FIG. 17, will register or be aligned in the assembly.

Other modifications may be contemplated for the putting into practice of the invention. For instance, and specially with reference to the description of FIG. 1 and the discussion of the sliders and fixed terminals therein, the segment rings may be provided on the stator part of the machine and the rotor part may comprise the brushes connected permanently to the winding terminals. This is shown in FIGURES 2*a* and 4*a*. FIGURE 2*a* is a fragmentary front view of the rotor shown in FIGURE 4*a* showing brushes 30 and 31 mounted on the rotor and having direct contact with the winding conductors as shown. In the form illustrated in FIGURE 4*a* the rotor is constructed substantially as in FIGURE 4, with corresponding parts identified by like numerals, but instead of having the rings of segments 28 and 29 mounted on the outer face thereof, the brushes 30 and 31 are located in the outer annular portion of the rotor as shown. The stator plate 51 carrying the pole magnets **51*a* supports the conductive segment rings 28 and 29 on the inner face thereof and in a position so that brushes 30 and 31 engage the respective segment rings. These rings are connected by suitable connections to the changeover switches 12—13.**

I claim:

1. An electrical multipolar axial airgap rotating machine operable in a step by step fashion from a changeover of the current supply connections to the terminals of the rotor winding of the machine, comprising the combination of a stator having an inductor structure establishing magnetic poles spaced about the axis of the machine, a rotor having a winding made of flat conductors intimately secured to the insulating faces of an annular carrier over which they are distributed in two sets of half-turns with face-to-face connections between the ends of these half-turns to form a closed-circuit winding, at least two pairs of brushes spaced about the axis of the machine, adjacent pairs of brushes being angularly displaced by one polar pitch, each pair of brushes being located in a plane midway between two adjacent magnetic poles, two rings of conductor segments mounted concentric with the machine axis, each segment extending substantially over one half of the polar pitch and the segments in one ring being displaced relative to the segments of the other ring by one-half pole pitch, said brushes of each pair bearing on said two rings respectively, a connection extending from each segment of said rings to an individual point on said winding, the connection points to two adjacent segments in each ring being spaced apart by one-half of the polar pitch, and the connection points for the segments in one ring being located midway between the connection points for the segments in the other ring, a pair of current supply terminals, and a two-position transfer switch for alternately connecting said current supply terminals through said segments and brushes to selected pairs of connection points on said winding to produce progresive step-by-step movement of said rotor.

2. An electrical multipolar machine according to claim 1, wherein the conductor segment rings are formed of flat conductors intimately secured to an insulating carrier.

3. An electrical multipolar machine according to claim 1, wherein at least one conducting damping disk is mounted adjacent the rotor winding, said disk being cut with windows radially centered on the said connection points of the winding.

4. An electrical multipolar machine according to claim 2, wherein the rings are carried by the rotor and the brushes by the stator of the machine.

5. An electrical multipolar machine according to claim 4, wherein the rings are formed on the insulating carrier of one of the set of half-turns of the windings together with interconnections between their conductor segments and the connection points of said winding.

6. An electrical multipolar machine according to claim 4, wherein each of the rings is made together with one set of half-turns of the winding and together with its respective connections to points on said winding.

7. An electrical multipolar machine according to claim 4, wherein at least one of the rings is formed on a separate annular insulating carrier and applied over one face of the winding, the segment-to-winding connections passing through the said carrier.

8. An electrical multipolar machine according to claim 3, wherein said disk is applied over one face of the winding with the interposition of an insulating layer.

9. An electrical multipolar machine according to claim 8, wherein at least one of said rings is made over the said interposed insulating layer and the connections to the winding are made through the said layer.

10. An electrical multipolar machine according to claim 2, wherein the damping disk is mounted between the two half-turn faces of the winding with interposition of a pair of insulating layers between the faces of said disk and the two half-turn sets of conductors of the winding.

11. An electrical multipolar machine according to claim 2, wherein the damping disk is made of two parts, each made over an annular insulating layer and applied over one face of the winding.

12. An electrical multipolar machine according to claim 11, wherein each ring of conductor segments is made over a portion of the insulating layer receiving a part of the damping disk.

13. An electrical multipolar machine according to claim 1, wherein the pattern of the rotor winding is of the lap winding kind and as there many pairs of brushes are provided as there are pairs of magnetic poles in the machine.

14. An electrical multipolar machine according to claim 1, wherein the pattern of the rotor winding is of the wave winding kind and only two pairs of brushes are provided in the machine.

15. An electrical multipolar machine according to claim 14, wherein further the inductor part of the machine comprises a smaller number of actual magnetic pole pieces with respect to the number of poles defined by the winding pattern of the rotor.

16. An electrical multipolar machine according to claim 1, wherein the conductor segment rings are formed in the stator structure of the machine and the brushes affixed to the rotor and connected to the said spaced joints of the winding.

17. An electrical multipolar machine according to claim 16, wherein a plate of rigid magnetic and insulating material is applied on one side of the rotor winding and the brushes are affixed to said plate.

No references cited.